April 5, 1960 M. P. TUBINIS 2,931,922

ELECTRONIC RING COUNTER HAVING SEQUENTIALLY TRIGGERED BISTABLE STAGES

Filed Feb. 24, 1958

INVENTOR.
MATTHEW P. TUBINIS

BY F. H. Henson

ATTORNEY

United States Patent Office 2,931,922
Patented Apr. 5, 1960

2,931,922

ELECTRONIC RING COUNTER HAVING SEQUENTIALLY TRIGGERED BISTABLE STAGES

Matthew P. Tubinis, Penfield, N.Y., assignor to General Dynamics Corporation, Rochester, N.Y., a corporation of Delaware Application February 24, 1958, Serial No. 716,949

2 Claims. (Cl. 307—88.5)

This invention relates in general to electronic counter circuits and, more particularly, to electronic counters of the type in which each stage, in turn, is triggered from one stable operated condition to another stable operated condition under control of trigger pulses simultaneously applied to all of the stages.

Electronic counters may be either of the ring or open chain type. Ring counters are conventionally used as distributors or pulse commutators. In some time division multiplex system applications, the ring counter is continuously stepped under control of a master oscillator and the output signals from the individual stages of the ring counter are utilized to define individual time positions which recur in repetitive time position frames. In other applications, the ring counter is used to control the assignment of individual circuits for use in turn by the application of mark signals to conductors individual to those circuits. Open chain counters may be used as digit registers in automatic telephone systems or in any other application where it is necessary to count different numbers of trigger pulses during different cycles of operation of the counter.

In most of the counter circuits of the prior art, each trigger pulse serves to reset the operated stage and the transient or carry pulse produced by the stage being reset is used to trigger the next succeeding stage to its operated condition. The carry pulse must either overcome the effect of the trigger pulse on the next succeeding stage or must be of longer duration than the trigger pulse. In circuits of this type, reliable operation is difficult to obtain and the changeover time between stages is relatively long. Some counters of the prior art obtain positive drive for both resetting the operated stage and for operating the next succeeding stage by the use of two trigger pulses of opposite polarity simultaneously applied to two inputs of each counter stage. Counters of the latter type require complex gating between stages and are limited to an even number of stages.

Accordingly, it is the general object of this invention to provide a new and improved electronic counter.

It is a more particular object of this invention to provide a new and improved electronic counter which is reliable in operation, has a fast changeover time between stages, and which comprises a minimum of circuit elements.

The present invention accomplishes the above cited objects by providing an electronic counter circuit in which positive drive is obtained for both resetting the operated stage and for operating the next succeeding stage from a single trigger pulse. In accordance with the invention, each stage of the counter comprises a bi-stable circuit, which may be a junction transistor flip-flop circuit, having first and second inputs for triggering the circuit to its first and second operated conditions, respectively, the second input of each stage is connected to the first input of the next succeeding stage, and a trigger pulse is selectively applied to the connection between the stage operated to its first operated condition and the next succeeding stage. Selective triggering is accomplished by unidirectional conducting devices connected in individual connections between the trigger pulse carrying conductor and the connections between stages. Each stage of the counter comprises means for biasing the device connected to the connection between that stage and the next succeeding stage to pass a trigger pulse only when that stage is in its first operated condition. Thus, the trigger pulse coupled through a particular diode is applied to the second input of one stage to reset that stage and is also applied to the first input of the next succeeding stage to operate that stage to its first operated condition.

Further objects and advantages of the invention will become apparent as the following description proceeds, and features of novelty which characterize the invention will be pointed out in particularity in the claims annexed to and forming a part of this specification.

For a better understanding of the invention, reference may be had to the accompanying drawing which comprises three figures on a single sheet.

Figure 1:
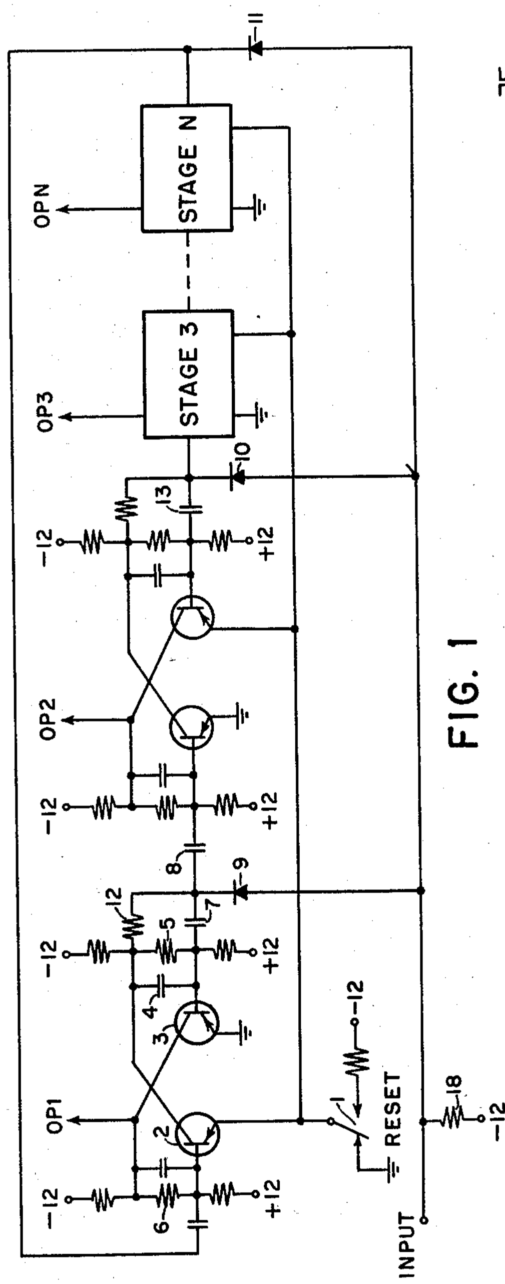
Fig. 1 shows circuit details of an N stage ring counter.

The ring counter of Fig. 1 comprises N stages, and each stage comprises a flip-flop circuit which is entirely conventional in design. The first stage flip-flop circuit, which is identical to the remaining flip-flop circuits, has a first input connected to the base of transistor 2 and a second input connected to the base of transistor 3. If a positive-going trigger pulse is applied to the first input when transistor 2 is conductive, transistor 2 is rendered non-conductive and the resulting negative potential swing at its collector is coupled through capacitor 4 and resistor 5 to trigger transistor 3 conductive. The resulting ground potential at the collector of conducting transistor 3 is coupled through resistor 6 to hold transistor 2 non-conductive. Similarly, if a positive-going trigger pulse is applied to the second input when transistor 3 is conductive, transistor 3 is rendered non-conductive and transistor 2 is triggered conductive. Under these conditions, transistor 2 is held conductive from negative potential at the collector of non-conducting transistor 3 through resistor 6, and transistor 3 is held non-conductive from ground potential at the collector of conducting transistor 2 through resistor 5. Thus, it can be seen that the flip-flop circuit is bi-stable in operation and remains in the operated condition to which it is triggered until it is triggered to its other operated condition.

The second input of each flip-flop circuit of the ring counter is coupled to the first input of the next succeeding flip-flop circuit of the ring counter by a pair of series connected capacitors. For example, the second input of the first stage is connected to the first input of the second stage by series connected capacitors 7 and 8. A unidirectional conducting device is connected between the junction joint of each pair of series connected capacitors and the common input conductor. For example, diode 9 is connected between the junction point of capacitors 7 and 8 and the input conductor, diode 10 is connected between the junction point of the capacitors interconnecting stages 2 and 3 and the input conductor, and diode 11 is connected between the junction point of the capacitors interconnecting stages N and 1 and the input conductor.

When the ring counter is first placed in operation, reset key 1 is momentarily operated to apply minus twelve volt potential to the emitter electrode of transistor 2 in the first stage flip-flop circuit and to the emitter electrodes of the transistors corresponding to transistor 3 in the remaining flip-flop circuits. Responsive to the momentary application of negative potential to the above identified emitter electrodes, the ring counter is initially operated to the condition wherein transistor 3 in the first flip-flop circuit and the transistors corresponding to transistor 2 in the remaining flip-flop circuits are conductive. Under these conditions, the cathode terminal of diode 9 is returned through resistor 12 to the negative potential appearing at the collector of non-conducting transistor 2 while the cathode terminal of each of the remaining diodes, such as diodes 10 and 11, is returned through a resistor corresponding to resistor 12 to ground potential appearing at the collector of the conducting transistor corresponding to transistor 2 in each of the remaining stages. In the absence of a trigger pulse, diodes 10 and 11 are biased twelve volts in the reverse direction since their cathode terminals are returned to ground potential and their anode terminals are returned to minus twelve volt potential through resistor 18, while diode 9 is biased only a slight degree in the reverse direction since its cathode is returned to negative potential and its anode is returned to minus twelve volt potential through resistor 18.

Figure 2:
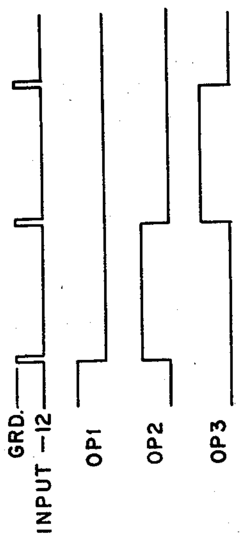
Fig. 2 is a pulse chart of input pulses for controlling the counter of Fig. 1, and of output pulses produced by the counter of Fig. 1.

When a positive-going trigger pulse is applied to the input conductor, said pulse is passed by diode 9 and coupled through capacitor 7 to the second input of the first stage flip-flop circuit to render transistor 3 non-conductive and transistor 2 conductive to thereby reset the first stage flip-flop circuit. The positive-going trigger pulse passed by diode 9 is also coupled through capacitor 8 to the first input of the second stage flip-flop circuit to render the transistor corresponding to transistor 2 non-conductive and the transistor corresponding to transistor 3 conductive and thus advance the setting of the ring counter to the condition wherein the second stage is in its first operated condition. Prior to the time when the transistor corresponding to transistor 2 in the second stage flip-flop circuit is triggered non-conductive, the right-hand terminal of capacitor 13 and the cathode terminal of diode 10 are returned to ground potential, as previously described. When the transistor corresponding to transistor 2 in the second stage flip-flop circuit is triggered non-conductive by the trigger pulse coupled through diode 9 and capacitor 8, its collector potential, of course, drops toward a negative value but diode 10 becomes conductive to maintain the right-hand terminal of capacitor 13 at ground potential. There is, therefore, no change of potential at the cathode of diode 10 and the right-hand terminal of capacitor 13 even though the trigger pulse still persists and the input conductor therefore stands at ground potential. Thus, the exact length or duration of each trigger pulse is not critical and the ring counter advances just one step per trigger pulse. Each stage of the ring counter is operated in turn to its first operated condition and the Nth trigger pulse resets stage N and triggers stage 1 to its first operated condition. A positive-going output signal is obtained from each stage in turn, as illustrated in Fig. 2. As illustrated, output conductors OP1–OPN, inclusive, are connected to the collector electrode of the transistor corresponding to transistor 3 in each stage of the ring counter and a positive-going signal is applied to these conductors in turn as the transistor corresponding to transistor 3 in each stage becomes conductive. It should be noted that the disclosed ring counter can comprise an unlimited number of stages without unduly loading the circuit which supplies the trigger pulses since each trigger pulse is coupled through a single diode regardless of the number of stages.

Figure 3:
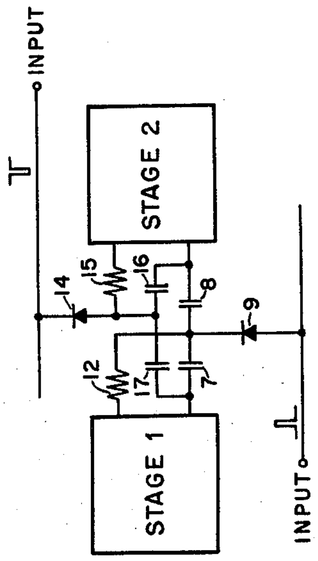
Fig. 3 shows the modification required to convert the ring counter of Fig. 1 to a reversing counter.

As illustrated in Fig. 3, the ring counter disclosed in Fig. 1 can be converted to a reversing ring counter by the addition of a duplicate set of stage interconnecting components. Like elements in Figs. 1 and 3 have been given the same numerical designation so that they can be readily identified. As previously described in conjunction with Fig. 1, forward drive is achieved by coupling a positive-going trigger pulse through diode 9 and capacitor 7 to reset stage 1, and through diode 9 and capacitor 8 to operate stage 2 to its first operated condition whenever the cathode terminal of diode 9 is returned to negative potential at the collector of transistor 2 in stage 1. Similarly, when the transistor corresponding to transistor 3 in stage 2 is conductive, the anode terminal of diode 14 is returned to ground potential at the collector of that transistor through resistor 15. Under these conditions, if a negative trigger pulse is applied to the upper input conductor, said pulse is passed by diode 14, coupled through capacitor 16, and applied to the first input of the second stage to render the transistor corresponding to transistor 2 in that stage conductive and thus reset the second stage. The negative pulse coupled through diode 14 is also coupled through capacitor 17 and applied to the second input of the first stage to render transistor 3 conductive and thus trigger the first stage flip-flop circuit to its first operated condition. Thus, it can be seen that the ring counter is controlled to step one step in the forward direction by each positive-going trigger pulse applied to the lower input conductor, and is controlled to step one step in the reverse direction by each negative-going trigger pulse applied to the upper input conductor.

When the counter of Fig. 1 is to be used as a chain rather than a ring, the interconnection between stage N and stage 1 is, of course, omitted. When the illustrated circuit is used as a chain counter, reset switch 1 is momentarily operated to apply minus twelve volt potential to the emitter electrode of one transistor in each flip-flop circuit after each cycle of operation of the counter to reset the counter to stage 1. When the counter is reset to stage 1, it is, of course, in readiness to count another group of trigger pulses.

The circuits have been illustrated as comprising PNP junction transistors but it is to be understood that NPN junction transistors could be used in the exact same circuits by the reversal of the biasing potentials and the coupling diodes. When NPN transistors are used in the counter circuit, the counter is, of course, stepped in the forward direction by negative pulses and stepped in the reverse direction by positive pulses.

While there has been shown and described what is at present considered to be the preferred embodiments of the invention, modifications thereto will readily occur to those skilled in the art. It is not intended, therefore, that the invention be limited to the embodiments shown and described, and it is intended in the appended claims to cover all such modifications as fall within the true scope and spirit of the invention.

What is claimed is:

1. A counter comprising a plurality of bi-stable circuits, each of said circuits comprising first and second transistors having base, emitter, and collector electrodes, cross connecting means between the collector and base electrodes of said first and second transistors for triggering said first transistor to a particular state of conduction responsive to the application of a trigger pulse to the base of said second transistor and for triggering said second transistor to said particular state of conduction responsive to the application of a trigger pulse to the base of said first transistor, a plurality of capacitors, means for connecting a pair of said capacitors in series between the base of the first transistor in each circuit and the base of the second transistor in the next succeeding circuit, a conductor, a plurality of unidirectional conducting devices having first and second terminals, means for connecting the first terminals of said devices to said conductor, means for individually connecting the second terminals of said devices to the junction points of said pairs of capacitors, means for applying trigger pulses to said conductor, and means in each circuit for biasing the device connected to the junction point of the pair of capacitors interconnecting that circuit and the next succeeding circuit to pass a trigger pulse only when the first transistor in that circuit is in said particular state of conduction.

2. The counter of claim 1 in which the last named means comprises a resistor connected between the collector of said second transistor and the second terminal of said device.

References Cited in the file of this patent

UNITED STATES PATENTS

| | | |
|---|---|---|
| 2,521,787 | Grosdoff | Sept. 12, 1950 |
| 2,706,811 | Steele | Apr. 19, 1955 |
| 2,722,630 | Branch et al. | Nov. 1, 1955 |
| 2,808,203 | Geyer et al. | Oct. 1, 1957 |
| 2,848,608 | Nienburg | Aug. 19, 1958 |

OTHER REFERENCES

Proceedings of the IRE, vol. 41, No. 10, October 1953, pp. 1313–1320, "Electronic Circuits of the NAREC Computer" by P. C. Sherertz (page 1317 relied on).